United States Patent
Bussa et al.

(10) Patent No.: US 8,953,322 B2
(45) Date of Patent: Feb. 10, 2015

(54) ELECTRONIC CONTROL UNIT FOR THE MOTOR OF AN ELECTRIC FAN

(71) Applicant: Johnson Electric S.A., Murten (CH)

(72) Inventors: Marco Bussa, Viarigi (IT); Franco Quagliata, Viarigi (IT)

(73) Assignee: Johnson Electric S.A., Murten (CH)

( * ) Notice: Subject to any disclaimer, the term of this patent is extended or adjusted under 35 U.S.C. 154(b) by 229 days.

(21) Appl. No.: 13/720,562

(22) Filed: Dec. 19, 2012

(65) Prior Publication Data
US 2013/0155619 A1 Jun. 20, 2013

(30) Foreign Application Priority Data
Dec. 19, 2011 (IT) .............................. TO2011A1168

(51) Int. Cl.
| | | |
|---|---|---|
| *H05K 7/20* | (2006.01) | |
| *H05K 5/00* | (2006.01) | |
| *H05K 9/00* | (2006.01) | |
| *G06F 1/20* | (2006.01) | |
| *B60R 16/02* | (2006.01) | |

(52) U.S. Cl.
CPC ............ *H05K 7/20445* (2013.01); *H05K 5/006* (2013.01); *H05K 9/0039* (2013.01)
USPC ...... 361/707; 361/679.54; 361/704; 361/710; 361/714; 165/80.2; 165/80.3; 165/104.33; 174/50.52; 174/520

(58) Field of Classification Search
USPC ........................ 361/679.46, 679.54, 690–697, 361/704–714, 719–724, 736, 752, 760, 361/762; 165/80.2, 80.3, 104.33, 185; 257/706–727; 174/15.1, 15.2, 16.3, 50, 174/50.52, 520
See application file for complete search history.

(56) References Cited

U.S. PATENT DOCUMENTS

| | | | |
|---|---|---|---|
| 6,397,609 B1 * | 6/2002 | Shikata et al. ................... 62/179 |
| 7,085,138 B2 * | 8/2006 | Origlia ........................... 361/752 |
| 7,344,578 B2 | 3/2008 | Origlia |
| 8,605,449 B2 * | 12/2013 | Bussa et al. .................... 361/752 |
| 2003/0184973 A1 * | 10/2003 | Nagata et al. .................. 361/704 |
| 2005/0068750 A1 * | 3/2005 | Origlia ........................... 361/752 |
| 2011/0249413 A1 * | 10/2011 | Bussa et al. .................... 361/752 |
| 2011/0310560 A1 * | 12/2011 | Jarmany ......................... 361/697 |

FOREIGN PATENT DOCUMENTS

EP 0 768 212 A2 * 4/1997 .............. B60R 16/02

* cited by examiner

*Primary Examiner* — Michail V Datskovskiy
(74) *Attorney, Agent, or Firm* — Muncy, Geissler, Olds & Lowe, P.C.

(57) ABSTRACT

An electronic control unit for a motor of an electric fan, has a support casing including a metal body adapted to act as a heat dissipator, a shell of an electrically insulating material coupled with the metal body, and a circuit board, mounted in contact with the dissipator body. The circuit board has a conductive connection member in the form of a flexible metal blade, electrically connected to the dissipator body, to provide an earth connection for the circuit board. The blade has a portion that projects beyond the edge of the board. The insulating shell has an internal formation which, upon coupling the shell with the dissipator body, interacts with the projecting portion of the blade, deforming it so as to bring it and thereafter maintain it in contact with the dissipator body in a resiliently loaded manner.

6 Claims, 3 Drawing Sheets

ELECTRONIC CONTROL UNIT FOR THE MOTOR OF AN ELECTRIC FAN

CROSS REFERENCE TO RELATED APPLICATIONS

This non-provisional patent application claims priority under 35 U.S.C. §119(a) from Patent Application No. TO2011A001168 filed in Italy on Dec. 19, 2011.

FIELD OF THE INVENTION

This invention relates to an electronic unit, and in particular to a control unit for the motor of an electric fan.

BACKGROUND OF THE INVENTION

In greater detail, the invention relates to an electronic unit of the type comprising: a support casing including a metal body adapted to act as a heat dissipator, and a shell of an electrically insulating material, in particular a plastics material, coupled with the metal body; and at least one circuit board mounted in the casing in contact with the dissipator body, the circuit board having at least one conductive member electrically connected to the dissipator body.

According to the prior art, the dissipator body of the support casing of such an electronic unit is generally connected to earth, and the circuits carried by the circuit board of the unit are connected to earth by means of that dissipator body.

In order to construct the connection between the circuit board and the dissipator body, there are known various systems which generally provide for the use of additional members, such as springs, screws, etc. Those methods for constructing the connection with respect to the dissipator body are not suitable for ease of automation and are relatively complex and costly in any case.

Hence there is a desire for an electronic unit of the type described above, which overcomes the above-mentioned disadvantages of the prior art.

SUMMARY OF THE INVENTION

Accordingly, in one aspect thereof, the present invention provides an electronic control unit for the motor of an electric fan, comprising: a support casing including a metal body adapted to act as a heat dissipator, and a shell of an electrically insulating material coupled with the metal body; and at least one circuit board, mounted in the casing in contact with the dissipator body, the circuit board having at least one conductive connection member electrically connected to the dissipator body; wherein the conductive connection member is a flexible metal blade, connected to circuits of the circuit board adjacent to an edge thereof, and a portion of which projects outside the board beyond the edge of the board; and the shell of insulating material has at least one internal formation which, upon coupling the shell with the dissipator body, interacts with the projecting portion of the blade, deforming it so as to bring it and thereafter maintain it in contact with the dissipator body, in a resiliently loaded condition.

Preferably, the blade is made of nickel.
Preferably, the blade is welded to the circuit board.
Preferably, the blade is welded to the circuit board.
Preferably, the shell is made of molded plastics material.
Preferably, the electric fan is a part of a cooling fan module for a radiator of a motor vehicle.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
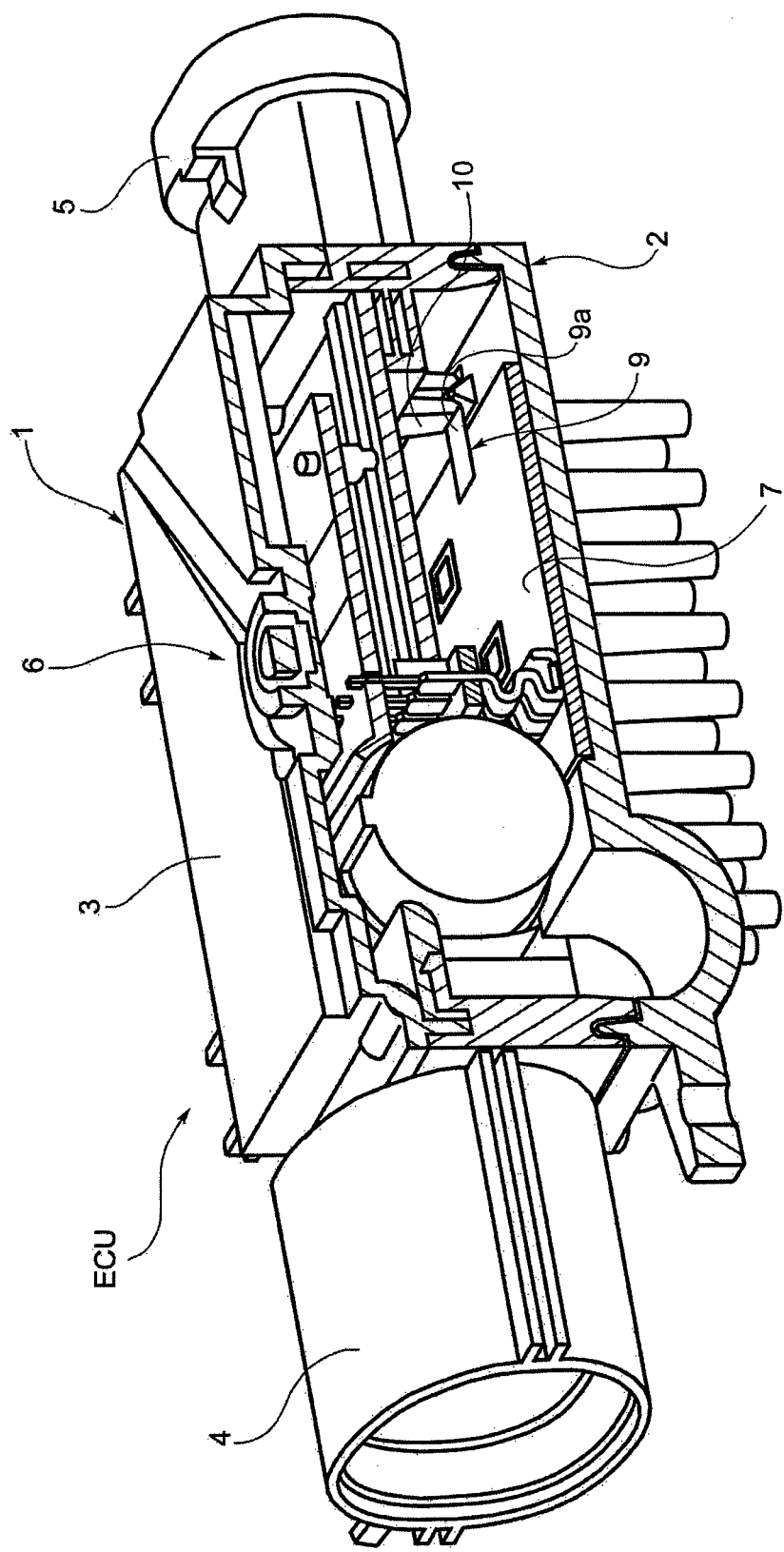
FIG. 1 is a perspective view, partially sectioned, of an electronic unit according to the preferred embodiment of the present invention.

In FIG. 1, an electronic unit according to the present invention is designated ECU. The unit ECU comprises a support casing which is generally designated 1. In a manner known per se, the support casing 1 comprises in the lower portion a shaped metal body 2 which is intended to be connected to an earthing conductor, for example, the metal structure of a motor vehicle, and which is able to act as a heat dissipator for the unit ECU.

In the upper portion, a shell 3 of electrically insulating material, preferably of molded plastics material, is connected to the dissipator body 2. In the preferred embodiment illustrated in FIG. 1, the shell has at the opposite ends formations 4 and 5 which are provided with respective electrically conductive connection members (not visible in FIG. 1).

In the construction shown in FIG. 1, in the central portion of the shell 3 there is provided a ventilation valve device 6 which is, for example, of the type according to patent U.S. Pat. No. 7,344,578 B2.

Inside the support casing 1, there is mounted on the dissipator body 2 a (at least one) circuit board designated 7. The circuit board is, for example, of the Insulated Metal Substrate (IMS) type and has a plurality of electronic components such as those designated 8 in FIGS. 2 and 3.

Figure 2:
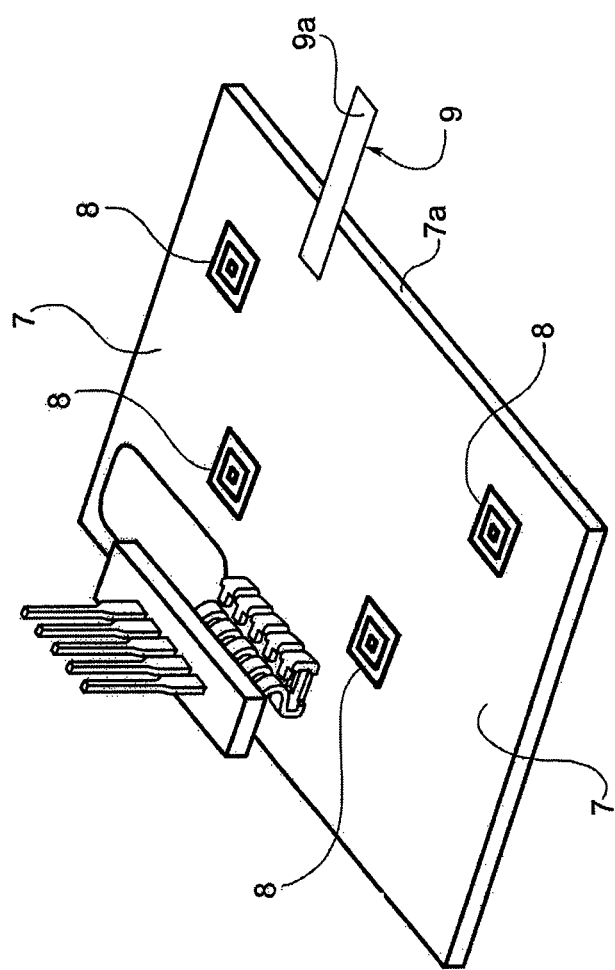
FIG. 2 is a perspective view of a circuit board included in the electronic unit of FIG. 1.
Figure 3:
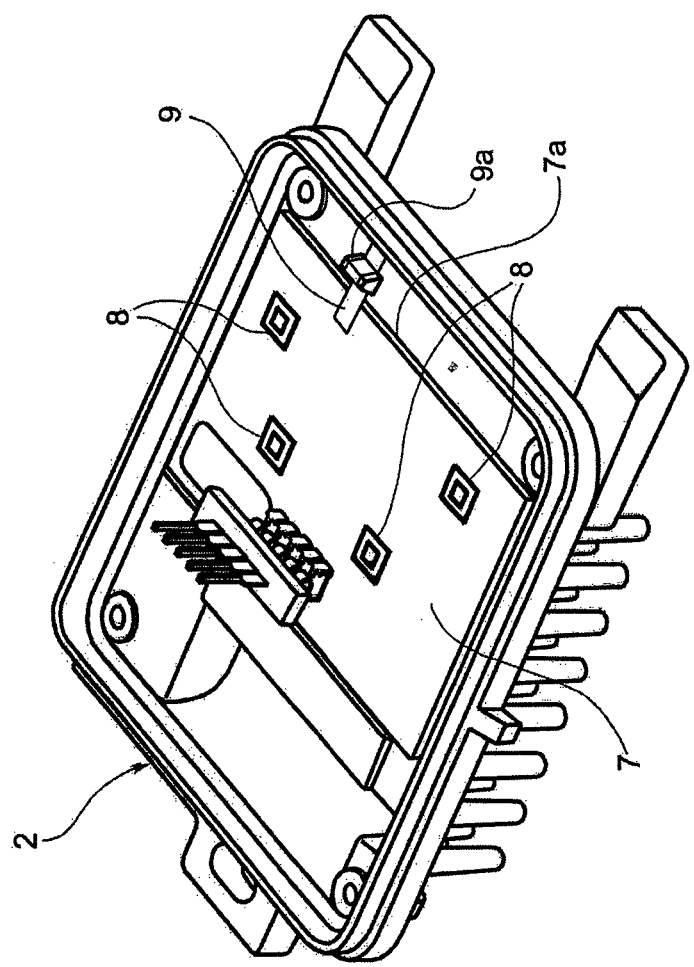
FIG. 3 is a perspective view which shows the circuit board of FIG. 2 arranged on a dissipator body that forms part of the casing of the electronic unit of FIG. 1.

With particular reference to FIG. 2, the circuit board 7 has a (at least one) conductive connection member 9 which is operatively connected and maintained in contact with the dissipator body 2 in the manner which will be described in greater detail below. The conductive connection member 9 is in the form of a flexible blade or strip, preferably of nickel. The blade is connected to the circuit board 7 in the region of an edge 7a thereof, and has a portion 9a which projects outwards from the board 7, beyond the edge 7a thereof.

As can be seen in FIG. 1, the shell 3 of electrically insulating material has at the inner side thereof at least one formation 10 which, when the shell 3 is connected to the dissipator body 2, is capable of interacting with the projecting portion 9a of the blade 9, deforming it so as to carry it, and then maintain it in a resiliently deformed state, against the dissipator body 2.

The solution described above ensures a connection to earth of the circuits of the board 7, without any need for the use of additional members such as springs, screws, etc. Thus the cost of the construction of that connection to earth is therefore reduced.

Another advantage of the solution according to the present invention involves the connection to earth of the circuit board 7 being able to be brought about in a totally automated manner.

Furthermore, the fact that the shell 3 maintains the end 9a of the blade 9 in a state of resilient deformation or resilient loading against the dissipator body 2 ensures an effective connection to earth, even in the event of occurrences during use of any structural deformation of the unit ECU in general.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. An electronic control unit for the motor of an electric fan, comprising:

a support casing including a metal body adapted to act as a heat dissipator, and a shell of an electrically insulating material coupled with the metal body; and at least one circuit board, mounted in the casing in contact with the dissipator body, the circuit board having at least one conductive connection member electrically connected to the dissipator body;

wherein the conductive connection member is a flexible metal blade, connected to circuits of the circuit board adjacent to an edge thereof, and a portion of which projects outside the board beyond the edge of the board; and the shell of insulating material has at least one internal formation which, upon coupling the shell with the dissipator body, interacts with the projecting portion of the blade, deforming it so as to bring it and thereafter maintain it in contact with the dissipator body, in a resiliently loaded condition.

2. The electronic control unit of claim 1, wherein the blade is made of nickel.

3. The electronic control unit of claim 1, wherein the blade is welded to the circuit board.

4. The electronic control unit of claim 2, wherein the blade is welded to the circuit board.

5. The electronic control unit of claim 1, wherein the shell is made of molded plastics material.

6. The electronic control unit of claim 1, wherein the electric fan is a part of a cooling fan module for a radiator of a motor vehicle.

* * * * *